United States Patent [19]

Akamatu

[11] 4,117,757

[45] Oct. 3, 1978

[54] RECTANGULAR WAVEFORM SIGNAL REPRODUCING CIRCUIT FOR ELECTRONIC MUSICAL INSTRUMENTS

[75] Inventor: Keiji Akamatu, Takatsuki, Japan

[73] Assignee: Roland Corporation, Japan

[21] Appl. No.: 768,585

[22] Filed: Feb. 14, 1977

[30] Foreign Application Priority Data

Feb. 16, 1976 [JP] Japan .................................. 51-16332

[51] Int. Cl.2 .......................... G10H 1/00; H03K 5/13

[52] U.S. Cl. ...................................... 84/1.01; 84/1.03; 307/261; 328/32

[58] Field of Search ............... 307/260, 261, 106, 108, 307/107; 328/13, 29, 32, 28; 235/92 FQ; 324/78 D; 84/1.01, 1.03, 454, DIG. 20

[56] References Cited

U.S. PATENT DOCUMENTS

| | | | |
|---|---|---|---|
| 3,636,457 | 1/1972 | Hart | 307/261 |
| 3,745,367 | 7/1973 | Schindler | 307/108 |
| 4,041,894 | 8/1977 | Kimmich | 307/261 |

*Primary Examiner*—Robert K. Schaefer
*Assistant Examiner*—William L. Feeney
*Attorney, Agent, or Firm*—Marshall & Yeasting

[57] ABSTRACT

A rectangular waveform signal reproducing circuit for electronic musical instruments which is composed of a first charge-discharge circuit having a relatively small charge time constant and a relatively large discharge time constant for charging and discharging positive components of a monophonic signal, a second charge-discharge circuit having a relatively small charge time constant and a relatively large discharge time constant for charging and discharging negative components of the monophonic signal, first comparing means for comparing the monophonic signal with the output from the first charge-discharge ciruit to produce a first compared output representing that the level of the former is larger than that of the latter in the positive direction, second comparing means for comparing the monophonic signal with the output from the second charge-discharge circuit to produce a second compared output representing that the level of the former is larger than that of the latter in the negative direction, and a flip-flop having first and second input terminals respectively supplied with the first and second compared outputs to produce a rectangular waveform signal having the fundamental period of the monophonic signal.

3 Claims, 4 Drawing Figures

RECTANGULAR WAVEFORM SIGNAL REPRODUCING CIRCUIT FOR ELECTRONIC MUSICAL INSTRUMENTS

BACKGROUND OF THE INVENTION

1. Field of the Invention

This invention relates to a rectangular waveform signal reproducing circuit for electronic musical instruments, and more particularly to such a rectangular waveform signal reproducing circuit which reproduces from a monophonic signal a rectangular waveform signal having its fundamental period.

Heretofore, a sound display of a monophonic signal from a monophonic electronic musical instrument by playing it is provided without processing the signal. Further, there has also been employed such a method which provides a sound display of the monophonic signal after processing it.

By reproducing from the monophonic signal a rectangular waveform signal having its fundamental period which varies as playing of the musical instrument proceeds, then gating the monophonic signal with the rectangular waveform signal and then applying the gated signal to a tone filter, a processed monophonic signal can be obtained. With a sound display based on the processed monophonic signal obtained as described above, a solo melody sound can be produced which is different from that obtainable with a sound display of the non-processed monophonic signal. Further, by frequency dividing the rectangular waveform signal, then gating the monophonic signal with the frequency-divided rectangular signal and then applying the gated signal to a tone filter, another processed monophonic signal can be obtained. The signal thus obtained produces a sound display which differs in pitch from that of the abovesaid processed monophonic signal.

Moreover, by converting the rectangular waveform signal reproduced from the monophonic signal into a DC signal having a voltage corresponding to its frequency and then applying the DC signal to a musical synthesizer, a sound signal having a desired pitch or tone can be obtained and, further, signals that the envelope and amplitude of the abovesaid signal are respectively modulated can be obtained.

This invention concerns a rectangular waveform signal reproducing circuit for electronic musical instruments which reproduces from a monophonic signal a rectangular waveform signal having the fundamental period of the monophonic signal which can be used for the abovesaid purpose.

2. Description of the Prior Art

In reproducing from a monophonic signal a rectangular waveform signal having its fundamental frequency, difficulties arise from the facts that the monophonic signal has a waveform containing high harmonic waves superimposed on the fundamental wave, that the period and amplitude of the fundamental wave vary as playing of an electronic musical instrument proceeds and that the amplitudes of the high harmonics also change as playing of the electronic musical instrument proceeds.

An attempt has heretofore been made to reproduce from the monophonic signal the rectangular waveform signal having its fundamental period. Owing to the abovesaid difficulties, however, such a rectangular waveform signal cannot be obtained unless the circuit for reproducing such a rectangular waveform signal becomes complicated and bulky or unless the rectangular waveform signal is trimmed by undesirable pulses.

SUMMARY OF THE INVENTION

Accordingly, this invention is to provide a novel rectangular waveform signal reproducing circuit for electronic musical instruments which is free from the abovesaid defects or faults and which allows ease in reproducing from a monophonic signal the abovesaid rectangular waveform signal.

DESCRIPTION OF THE PREFERRED EMBODIMENTS

Figure 1:
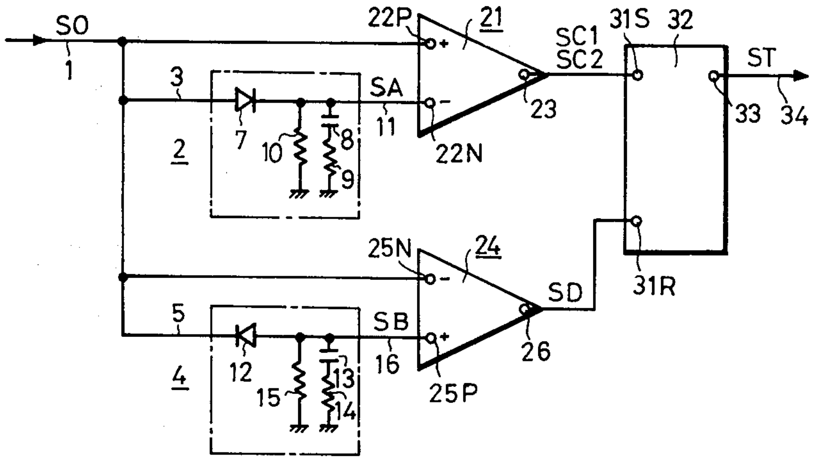
FIG. 1 is a system diagram showing one embodiment of the rectangular waveform signal reproducing circuit of this invention.
Figure 2:
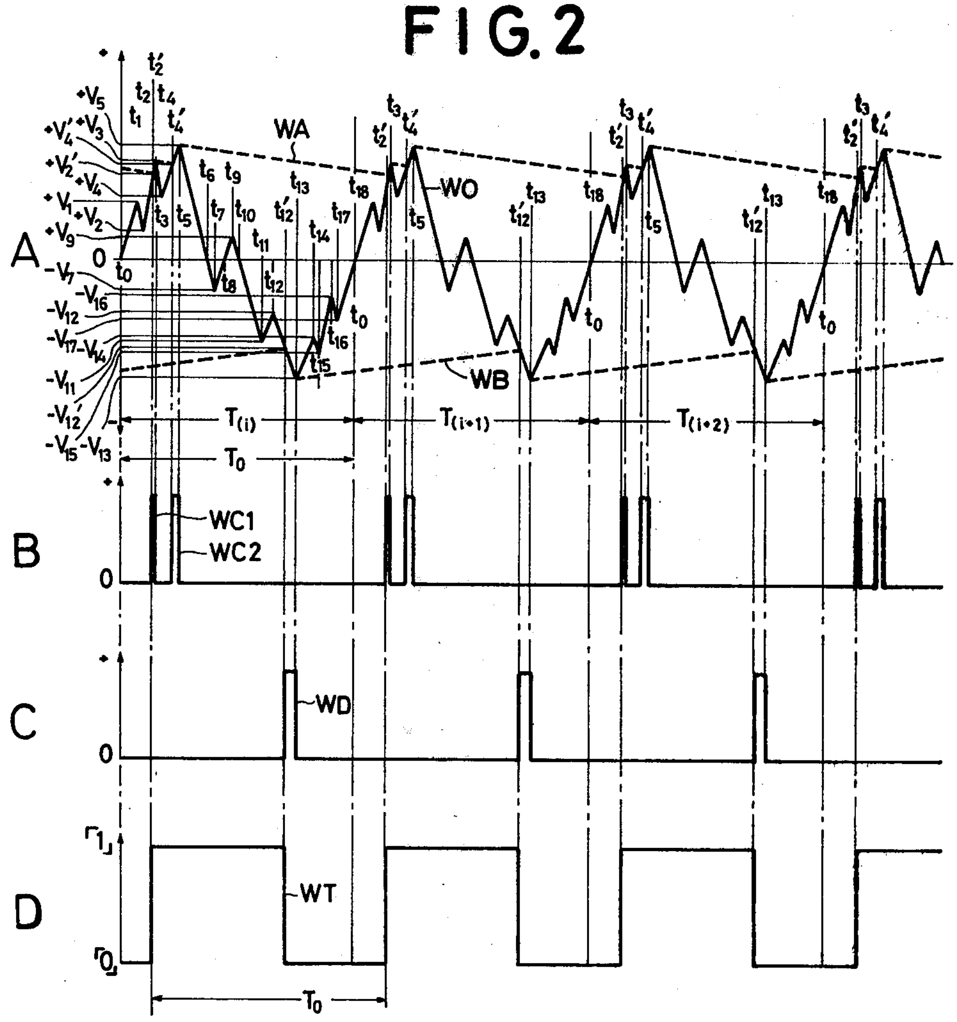
FIG. 2 is a waveform diagram explanatory of the embodiment of this invention shown in FIG. 1.

Referring first to FIG. 1, a monophonic signal SO is supplied to an input line indicated by reference numeral 1. The monophonic signal SO is derived from a monophonic electronic musical instrument upon playing it, and has a waveform having periodicity. An example of the waveform of such a monophonic signal SO is identified by reference character WO in FIG. 2A. The waveform WO goes in the positive direction across a reference level (a zero level) at a moment $t_0$ to take a positive extremal value $+V_1$ at a moment $t_1$, from thence turns to the negative direction to take a positive extremal value $+V_2$ at a moment $t_2$, from thence turns to the positive direction to take a positive extremal value $+V_3$ larger than the value $+V_1$ at a moment $t_3$, from thence turns to the negative direction to take a positive extremal value $+V_4$ at a moment $t_4$, from thence turns to the positive direction to take a positive maximum extremal value $+V_5$ at a moment $t_5$, from thence turns to the negative direction to cross the reference level at a moment $t_6$ to take a negative extremal value $-V_7$ at a moment $t_7$, from thence turns to the positive direction to go across the reference level at a moment $t_8$ to take a positive extremal value $+V_9$ smaller than the maximum extremal value $+V_5$ at a moment $t_9$, from thence turns to the negative direction to intersect the reference level at a moment $t_{10}$ to take a negative extremal value $-V_{11}$ at a moment $t_{11}$, from thence turns to the positive direction to take a negative extremal value $-V_{12}$ at a moment $t_{12}$, from thence turns to the negative direction to take a negative maximum extremal value $-V_{13}$ at a moment $t_{13}$, from thence turns to the positive direction to take a negative extremal value $-V_{14}$ at a moment $t_{14}$, from thence turns to the negative direction to take a negative extremal value $-V_{15}$ at a moment $t_{15}$, from thence turns to the positive direction to take a negative extremal value $-V_{16}$ at a moment $t_{16}$, from thence turns to the negative direction to take a negative extremal value $-V_{17}$ at a moment $t_{17}$, and then, from thence turns to the positive direction to cross the reference level at a moment $t_{18}$ ($t_0$). As shown in FIG. 2A, the waveform WO repeatedly undergoes such level variation. The monophonic signal SO, indicated by the waveform WO in FIG. 2A, is a signal having a waveform which has such periodicity that the time $T_0$ from the moment $t_0$ to $t_{18}$ is one period. In FIG. 2, there are indicated by $T_{(i)}$, $T_{(i+1)}$, $T_{(i+2)}$, . . . sequential periods each of which corresponds to the time between the moments $t_0$ to $t_{18}$ in the monophonic signal SO having the waveform WO. For the sake of simplicity, the waveform WO of the monophonic signal SO in FIG. 2 is shown with adjacent points of extremal values joined to each other in a straight line.

The monophonic signal SO having such a waveform WO as shown in FIG. 2A is supplied to an input line 3 of a charge-discharge circuit 2 and an input line 5 of another charge-discharge 4. The charge-discharge circuit 2 charges and discharges the positive components of the monophonic signal SO. The charge time constant of the charge-discharge circuit 2 is selected sufficiently small so that when the level of the monophonic signal SO exceeds the output level of the circuit 2 in the positive direction, the circuit 2 rapidly follows it to achieve charging. However, the discharge time constant of the charge-discahrge circuit 2 is selected sufficiently larger than the charge time constant. Such a charge-discharge circuit 2 has an arrangement such, for example, as shown in FIG. 1 in which the input line 3 is connected to one end of a capacitor 8 through a diode 7 in its forward direction, the other end of the capacitor 8 is connected, if necessary, through a resistor 9 of a small resistance value to a point having the reference level, that is, grounded, the end of the capacitor 8 on the side of the diode 7 is grounded through a discharging resistor 10 and is connected to an output line 11. In this case, the capacitance of the capacitor 8 and the resistances of the resistors 9 and 10 are, for instance, 0.047 μF, 100 Ω and 220 KΩ, respectively. Accordingly, there is derived from the output line 11 of the charge-discharge circuit 2 an output SA having such a waveform WA as indicated by the broken lines in FIG. 2A. The waveform WA has such a positive level which takes the positive maximum extremal value $+V_5$ at the moment $t_5$ in the period $T_{(i+j)}$, (where $j = 1, 2, 3, \ldots$) from thence gradually lowers in the negative direction with the lapse of time to meet the waveform WO at a moment $t_2'$ between the moments $t_2$ and $t_3$ in the period, for example, $T_{(i+j+1)}$ to take a value $+V_2'$ at the moment $t_2$, from thence extends along the portion of the waveform WO between the moments $t_2'$ and $t_3$ to take the extremal value $+V_3$ at the moment $t_3$, from thence gradually goes down in the negative direction with the lapse of time to meet the waveform WO at a moment $t_4'$ between the moments $t_4$ and $t_5$ to take a value $+V_4'$, from thence extends along the portion of the waveform WO between the moments $t_4'$ and $t_5$ to take the maximum extremal value $+V_5$, from thence gradually falls in the negative direction with the lapse of time to meet the waveform WO at the moment $t_2'$ between the moments $t_2$ and $t_3$ in the period $T_{(i+j+2)}$ to take the value $+V_2'$ at the point $t_2'$, and thereafter repeatedly undergoes the same fluctuations as mentioned above.

The charge-discharge circuit 4 charges and discharges the negative components of the monophonic signal SO. The charge time constant of this circuit 4 is selected sufficiently small so that when the level of the monophonic signal SO exceeds the output level of the circuit 4 in the negative direction, the circuit 4 rapidly follows it to effect charging. On the other hand, the discharge time constant of the circuit 4 is chosen sufficiently larger than the charge time constant. The charge-discharge circuit 4 has a construction such, for instance, as illustrated in FIG. 1 in which an input line 5 is connected to one end of a capacitor 13 through a diode 12 in its backward direction, the other end of the capacitor 13 is grounded, if necessary, through a resistor 14 having a small resistance value, and the end of the capacitor 13 on the side of the diode 12 is grounded through a discharging resistor 15 and connected to an output line 16. In this case, the capacitance of the capacitor 13 and the resistances of the resistors 14 and 15 are respectively selected equal to those of the capacitor 8 and the resistor 9 and 10 referred to previously. Accordingly, there is derived from the output line 16 of the charge-discharge circuit 4 an output SB having such a waveform WB as indicated by the broken lines in FIG. 2A. The waveform WB has such a negative level which takes the negative maximum extremal value $-V_{13}$ at the moment $t_{13}$ in the period $T_{(i+j)}$, from thence gradually lowers in the positive direction with the lapse of time to meet the waveform WO at a moment $t_{12}'$ between the moments $t_{12}$ and $t_{13}$ in the period, for instance, $T_{(i+j+1)}$ to take a value $-V_{12}'$ at the moment $t_{12}'$, from thence extends along the portion of the waveform WO between the moments $t_{12}'$ and $t_{13}$ to take the maximum extremal value $-V_{13}$ at the moment $t_{13}$, from thence gradually goes down in the positive direction with the lapse of time, and thereafter repeats the abovesaid variations.

The monophonic signal SO having the waveform WO described above in respect of FIG. 2A, which is supplied from the input line 1, and the output SA of the waveform WA shown in FIG. 2A, which is derived from the output line 11 of the charge-discharge circuit 2, are respectively applied to positive and negative input terminals 22P and 22N of a comparator 21. The comparator 21 has a known construction that it has an output terminal 23 in addition to the positive and negative input terminals 22P and 22N and that where the value of a voltage applied to the input terminal 22P exceeds in the positive direction the value of a voltage applied to the input terminal 22N, a voltage is produced which has a positive constant level while the voltage value at the input terminal 22P is larger than that at the terminal 22N. Consequently, there are derived at the output terminal 23 of the comparator 21 outputs SC1 and SC2 which have pulse waveforms WC1 and WC2, respectively, such as shown in FIG. 2B which have positive levels between the moments $t_2'$ and $t_3$ and between the moments $t_4'$ and $t_5'$ in each period $T_{(i+j)}$ of the monophonic signal SO, respectively.

The monophonic signal SO having the waveform WO described previously with regard to FIG. 2A, which is supplied to the input terminal 1, and the output SB having the waveform WB described above in respect of FIG. 2A, which is derived from the output terminal 16 of the charge-discharge circuit 4, are respectively applied to a negative and a positive input terminal 25N and 25P of a comparator 24. The comparator 24 has a construction, similar to that of the comparator 21, that it has an output terminal 26 in addition to the abovesaid negative and positive input terminals 25N and 25P and that when the value of a voltage applied to the input terminal 25N exceeds in the negative direction the value of a voltage applied to the input terminal 25P, a voltage is produced which has a positive constant level while the voltage value at the input terminal 25N is larger than that at the input terminal 25P. Consequently, there is derived from the output terminal 26 of the comparator 24 an output SD having a pulse waveform WD such as shown in FIG. 2C which has a positive level between the moments $t_{12}'$ and $t_{13}$ in the period $T_{(i+j)}$ of the monophonic signal SO.

The output SC1 and SC2, obtained from the output terminal 23 of the comparator 21, and the output SD, obtained from the output terminal 26 of the comparator 24, are applied to a set terminal 31S and a reset terminal 31R of a flip-flop 32, respectively. Accordingly, the flip-flop 32 is set by the leading edge of the output SC1 which arrives earlier than the output SC2 in each period $T_{(i+j)}$, and is then reset by the leading edge of the output SD. As a result of this, the flip-flop 32 derives at its output terminal 33 a signal ST having such a rectangular waveform WT as shown in FIG. 2D which is "1" in the binary expression between the moments $t_2'$ and $t_{12}'$ in the period $T_{(i+j)}$ of the monophonic signal SO and "0" in the binary expression between the moment $t_{12}'$ in the period $T_{(i+j)}$ and the moment $t_2'$ in the next period $T_{(i+j+1)}$. The signal ST thus obtained is applied to an output line 34 led out from the output terminal 33.

It is evident that the rectangular waveform signal ST thus obtained in the output line 34 is a signal having a waveform which has periodicity such that the time between the moment $t_2'$ (or $t_{12}'$) in the period $T_{(i+j)}$ and the moment $t_2'$ (or $t_{12}'$) in the next period $T_{(i+j+1)}$ is one period, and that this period is equal to that $T_0$ of the monophonic signal SO. Accordingly, it might be said that the rectangular waveform signal ST obtained in the output line 34 is a signal reproduced from the monophonic signal SO and having its fundamental period.

In the above, the waveform WO of the monophonic signal SO is described to have the waveform in FIG. 2A, but if the waveform WO changes from the waveform depicted in FIG. 2A, one or more outputs which have the same pulse waveform, as the abovesaid outputs SC1 and SC2 are obtained from the output terminal 23 of the comparator 21, and one or more outputs having the same pulse waveform as the above-said output SD are also derived from the output terminal 26 of the comparator 24, although no detailed description is given. However, the flip-flop 32 is set by the output from the output terminal 23 of the comparator 21 or a first one of the outputs therefrom and is reset by the output from the output terminal 26 of the comparator 24 or a first one of the outputs therefrom, so that as long as the period of the waveform WO of the monophonic signal SO remains unchanged, even if the rectangular waveform signal ST obtained from the output terminal 33 of the flip-flop 32 and consequently from the output line 34 differs in the moments of changing from "0" to "1" or vice versa from the waveform WT shown in FIG. 2D, the signal ST is obtained to have a rectangular waveform of the same period as the waveform WT shown in FIG. 2D at all times.

The foregoing has described that the rectangular waveform signal ST having the period $T_0$, based on the showing of FIG. 2A in which the waveform having no change in the period $T_0$ is indicated as the waveform WO of the monophonic signal SO, but the period $T_0$ of the waveform WO of the monophonic signal SO changes as playing of a monophonic electronic musical instrument proceeds. With the arrangement of the embodiment of this invention described above, however, even if the period $T_0$ of the monophonic signal SO changes, the rectangular waveform signal ST having the period $T_0$ which changes following the above change, can be derived at the output terminal 33 of the flip-flop 32, and accordingly in the output line 34, though no detailed description is made.

As described above, the embodiment of this invention described above has a striking feature that the rectangular waveform signal ST, which has the fundamental period of the monophonic signal SO and is not trimmed by undesirable pulses, can be reproduced from the signal SO with a simple arrangement comprising the two charge-discharge circuits 2 and 4, the two comparators 21 and 24 and the flip-flop 32.

Figure 3:
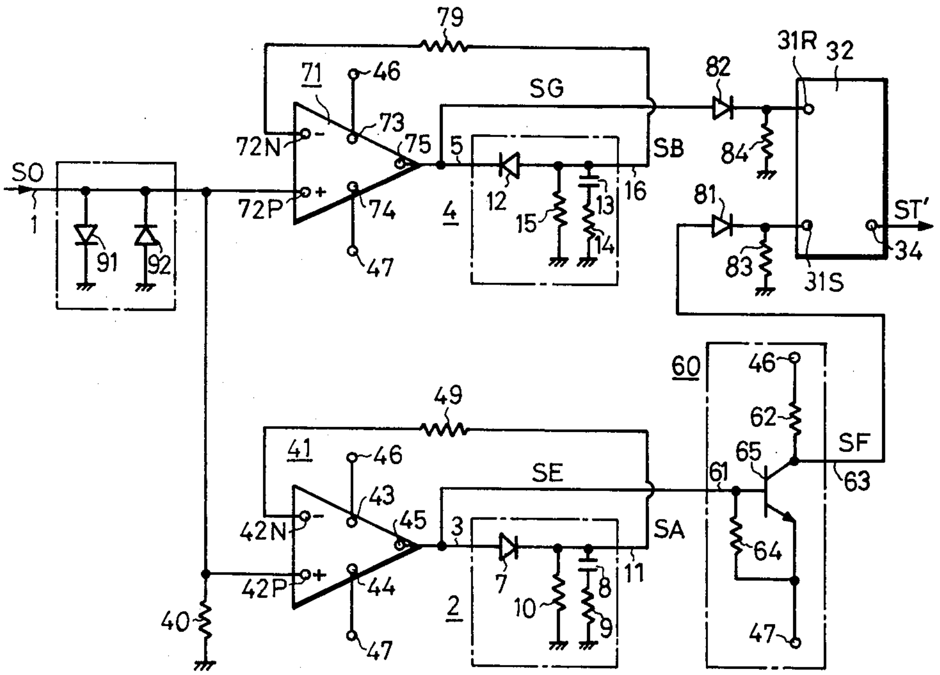
FIG. 3 is a system diagram illustrating another embodiment of this invention.
Figure 4:
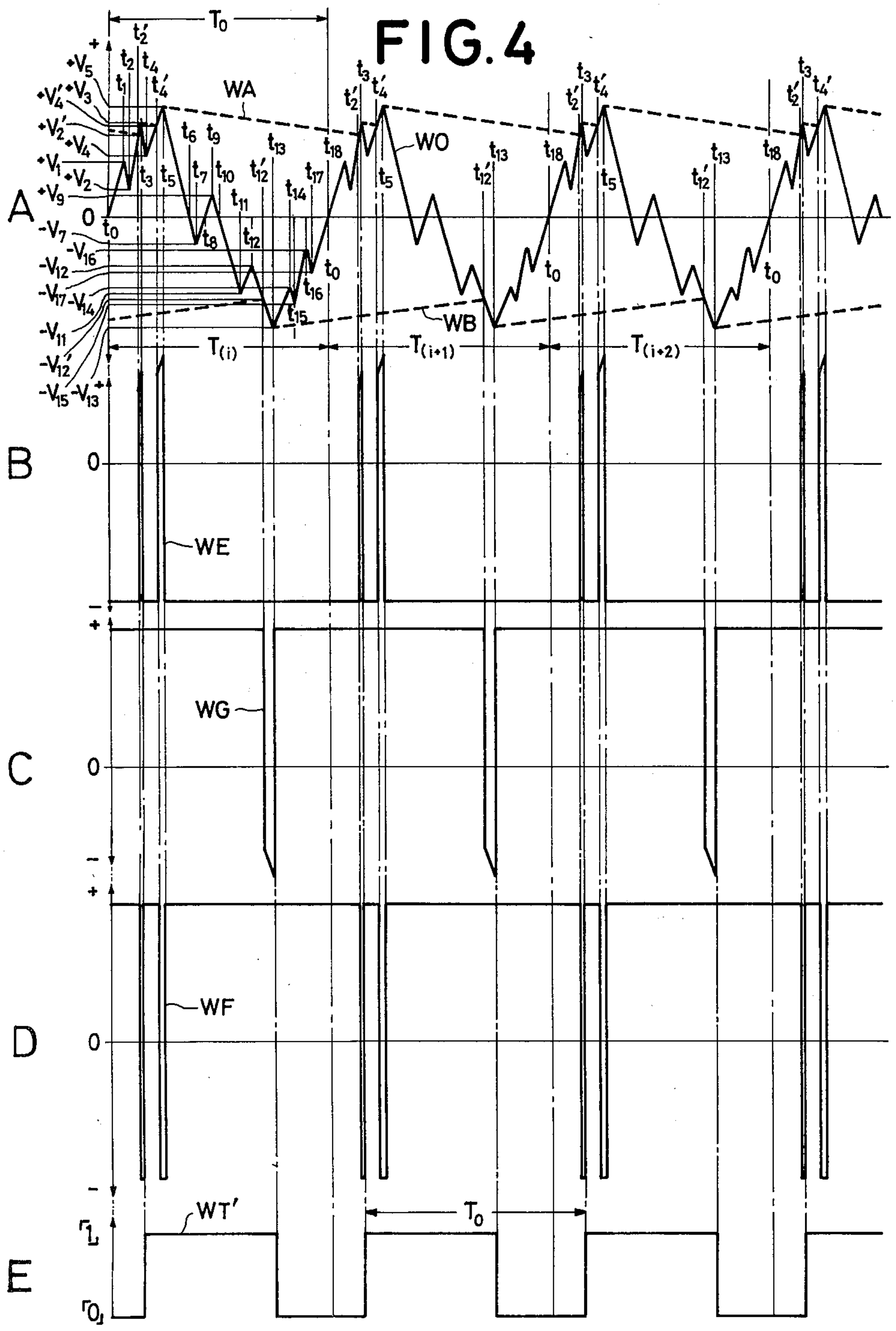
FIG. 4 is a waveform diagram explanatory of the embodiment of this invention illustrated in FIG. 3.

Turning next to FIG. 3, another embodiment of this invention will be described. In FIG. 3, parts corresponding to those in FIG. 1 are marked with the same reference numerals and no detailed description will be repeated. The input line 1, from which is obtained the monophonic signal SO having the waveform WO, such as shown in FIG. 4A which is similar to that described in connection with FIG. 2A, is grounded through a resistor 40 and the end of the resistor 40 on the opposite side from the ground is connected to a positive input terminal 42P of a known operational amplifier 41 which acts as comparing means. A pair of power terminals 43 and 44 of the operational amplifier 41 are respectively connected to power source terminals 46 and 47 from which are obtained positive and negative voltages $+V_C$ and $-V_C$, respectively. An output terminal 45 of the operational amplifier 41 is connected to the input line 3 of the charge-discharge circuit 2, the output line 11 of which is, in turn, connected through a resistor 49 to a negative input 42N of the operational amplifier 41. The positive components of the monophonic signal SO applied to the positive input terminal 42P of the operational amplifier 41 are charged in the capacitor 8 of the charge-discharge circuit 2 through the operational amplifier 41. As a result of this, in the output line 11 of the charge-discharge circuit 2, there is obtained the output SA having the same waveform as described in respect of FIG. 2A, as indicated by the broken-line waveform WA in FIG. 4A. Where the level of the output voltage derived at the output terminal 45 of the operational amplifier 41 exceeds the voltage level of the output SA in the positive direction, the output terminal 45 of the operational amplifier 41 is connected to the negative input terminal 42N of the operational amplifier 41 through the diode 7 of the charge-discharge circuit 2 and a resistor 49, but where the voltage level of the output derived at the output terminal 45 is smaller than the voltage level of the output SA in the negative direction, the output terminal 45 of the operational amplifier 41 is disconnected by the diode 7 from the input terminal 42N of the operational amplifier 41. Consequently, there is obtained at the output terminal 45 of the operational amplifier 41 an output SE having such a waveform WE as shown in FIG. 4B which has, between the moments $t_2'$ and $t_3$ and between $t_4'$ and $t_5$, a level extending along the portion of the waveform WO of the monophonic signal SO between the moments $t_2'$ and $t_3$ and between $t_4'$ and $t_5'$ but, in the other periods, has the level of the negative voltage $-V_C$ obtained at the output terminal 47 connected to the power source terminal 44, and accordingly rises at the moments $t_2'$ and $t_4'$ from the level of the voltage $-V_C$ to the levels $+V_2'$ and $+V_4'$ and then falls from the levels $+V_{13}$ and $+V_5$ to the level $-V_C$ at the moments $t_3$ and $t_5$, respectively.

The output terminal 45 of the operational amplifier 41, at which the output SE having the waveform WE shown in FIG. 4B is obtained, is connected to an input line 61 of a polarity inverter 60. The polarity inverter 60 is formed with, for example, a transistor 65 having the collector connected to the power source terminal 46 and an output line 63 through a resistor 62, the emitter connected to the power source terminal 47 and the base connected to the input line 61 and the power source terminal 47 through a resistor 64. Consequently, there is obtained in the output line 63 of the polarity inverter 60 an output SF having such a waveform WF as shown in FIG. 4D which has the level of the voltage $-V_C$ applied to the power source terminal 47 in the periods between the moments $t_2'$ and $t_3$ and between $t_4'$ and $t_5$, has the level of the voltage $+V_C$ applied to the power source terminal 46 in the other periods, and accordingly falls at the moments $t_2'$ and $t_4'$ from the level $+V_C$ to the level $-V_C$ and rises at the moments $t_3$ and $t_5$ from the level $-V_C$ to the level $+V_C$.

One end of the abovesaid resistor 40 on the side of the input line 1 is connected to a positive input terminal 72P of another operational amplifier 71, acting as another comparing means like the abovesaid operational amplifier 41. A pair of power terminals 73 and 74 of the operational amplifier 71 are respectively connected to the positive and negative power source terminals 46 and 47. An output terminal 75 of the operational amplifier 71 is connected to the input line 5 of the charge-discharge circuit 4, the output terminal 16 of which is connected to the negative input terminal 72N of the operational amplifier 71 through a resistor 79. The negative components of the monophonic signal SO applied to the positive input terminal 72P of the operational amplifier 71 are charged in the capacitor 13 of the charge-discharge circuit 4 through the operational amplifier 71. As a result of this, in the output line 16 of the charge-discharge circuit 4, there is derived the output SB which has the same waveform as described previously in connection with FIG. 2A, as indicated by the broken-line waveform WB in FIG. 4A. Where the voltage level of the output derived at the output terminal 75 of the operational amplifier 71 exceeds the voltage level of the output SB in the negative direction, the output terminal 75 of the operational amplifier 71 is connected to the negative input terminal 72N of the operational amplifier 71 through the diode 12 of the charge-discharge circuit 4 and a resistor 79. But where the voltage level of the output obtained at the output terminal 75 is smaller than the voltage level of the output SB in the positive direction, the output terminal 75 of the operational amplifier 71 is disconnected by the diode 12 from the negative input terminal 72N of the operational amplifier 71. In consequence, there is produced at the output terminal 75 of the operational amplifier 71 an output SG having such a waveform WB as depicted in FIG. 4C which has, between the moments $t_{12}'$ and $t_{13}$, a level extending along the portion of the waveform WO of the monophonic signal SO between the moments $t_{12}'$ and $t_{13}$ but, in the other periods, the level of the voltage $+V_C$ derived at the power source terminal 46 having connected thereto a power source terminal 73, and accordingly goes down from the level $+V_C$ to the level $-V_{12}'$ at the moment $t_{12}'$ and rises from the level $-V_{13}$ to the level $+V_C$.

The output line 63 of the polarity inverter 60, in which is produced the output SF having the waveform WF described above with regard to FIG. 4D, and the output terminal 75 of the operational amplifier 71, at which is obtained the output SG hving the waveform WG described previously in connection with FIG. 4C, are respectively connected to the set and reset terminals 31S and 31R of the flip-flop 32 through diodes 81 and 82 in their forward direction. The set and reset terminals 31S and 31R are grounded through resistors 83 and 84, respectively. Consequently, the flip-flop 32 is set by the output SF at an earlier one of its rise-up moments $t_3$ and $t_5$, i.e. at the moment $t_3$, and is reset by the output SG at its rise-up moment $t_{13}$. As a result of this, the flip-flop 32 derives at its output terminal 33 a signal ST' having such a rectangular waveform WT' as shown in FIG. 4E which is "1" in the binary expression between the moments $t_3$ to $t_{13}$ in the period $T_{(i+j)}$ of the monophonic signal SO and "0" between the moment $t_{13}$ in the period $T_{(i+j)}$ and the instant $t_3$ in the next period $T_{(i+j+1)}$, and the signal ST' is applied to an output line 34 led out from the output line 33

It is apparent that the rectangular waveform signal ST' thus obtained in the output line 34 has such periodicity that the time between the moment $t_3$ (or $t_{13}$) in the period $T_{(i+j)}$ and the moment $t_3$ (or $t_{13}$) in the next period $T_{(i+j+1)}$ is one period, and that the above period is equal to the period $T_0$ of the monophonic signal SO. Accordingly, the rectangular waveform signal ST' obtained in the output line 34 might be said to be a signal reproduced from the monophonic signal SO and having its fundamental period, as in the cases described previously in respect of FIGS. 1 and 2. Though not described in detail, the input line 1 is grounded through diodes 91 and 92 connected in parallel to each other in their backward direction to eliminate noises of unnecessarily large levels from the monophonic signal SO. Further, even if the waveform of the monophonic signal SO changes from the waveform shown in FIG. 4A, the rectangular waveform signal ST' is produced to have the rectangular waveform of the same period as the waveform WT' shown in FIG. 4E, as in the cases of FIGS. 1 and 2. Moreover, even if the period $T_0$ of the monophonic signal SO varies, the rectangular waveform signal can be obtained which has the period having changed following the variation, as in the cases of FIGS. 1 and 2.

As described in the foregoing, the embodiment of this invention set forth with respect to FIG. 3 has a feature that the rectangular waveform signal ST' having the fundamental period of the monophonic signal SO can be reproduced from the signal SO with a simple structure composed of the two operational amplifiers 41 and 71 serving as comparing means, the polarity inverter 60 and the flip-flop 32.

The foregoing description has been given of only two embodiments of this invention which should not be construed as limiting the invention specifically thereto, and many modifications and variations may be effected without departing from the scope of novel concepts of this invention.

I claim as my invention:

1. A rectangular waveform signal reproducing circuit for electronic musical instruments, comprising:

a first charge-discharge circuit having a relatively small charge time constant and a relatively large discharge time constant for charging and discharging positive components of a monophonic signal;

a second charge-discharge circuit having a relatively small charge time constant and a relatively large discharge time constant for charging and discharging negative components of the monophonic signal;

first comparing means for comparing the monophonic signal with the output from the first charge-discharge circuit to produce a first compared output representing that the level of the former is larger than that of thelatter in the positive direction;

second comparing means for comparing the monophonic signal with the output from the second charge-discharge circuit to produce a second compared output representing that the level of the former is larger than that of the latter in the negative direction; and a flip-flop having first and second input terminals respectively supplied with the outputs from the first and second comparing means to produce a rectangular waveform signal having the fundamental period of the monophonic signal.

2. The rectangular waveform signal reproducing circuit for electronic musical instruments according to claim 1, wherein the first comparing means is a first comparator having first and second input terminals, the second comparing means is a comparator having third and fourth input terminals, the first input terminal of the first comparator and the third input terminal of the second comparator are respectively supplied with the monophonic signal, the second input terminal of the first comparator and the fourth input terminal of the second comparator are respectively supplied with the outputs from the first and second charge-discharge circuits, and output terminals of the first and second comparators are respectively connected to the first and second input terminals of the flip-flop.

3. The rectangular waveform signal reproducing circuit for electronic musical instruments according to claim 1, wherein the first comparing means is a first operational amplifier having first and second input terminals, the second comparing means is a second operational amplifier having third and fourth input terminals, the first input terminal of the first operational amplifier and the third input of the second operational amplifier are supplied with the monophonic signal, the outputs of the first and second operational amplifiers are respectively supplied to the first and second charge-discharge circuits, the outputs from the first and second charge-discharge circuits are respectively applied to the second input terminal of the first operational amplifier and the fourth input terminal of the second operational amplifier, and the outputs of the first and second operational amplifiers are respectively supplied to the first and second input terminals of the flip-flop.

* * * * *